(12) United States Patent
Wissel (10) Patent No.: US 7,826,285 B2
(45) Date of Patent: *Nov. 2, 2010

(54) MEMORY COLUMN REDUNDANCY SCHEME

(75) Inventor: Larry Wissel, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 319 days.

This patent is subject to a terminal disclaimer.

(21) Appl. No.: 11/853,892

(22) Filed: Sep. 12, 2007

(65) Prior Publication Data

US 2009/0067269 A1    Mar. 12, 2009

(51) Int. Cl.
   *G11C 29/00*    (2006.01)
(52) U.S. Cl. .................................... 365/200; 365/201
(58) Field of Classification Search ................. 365/200, 365/201
   See application file for complete search history.

(56) References Cited

U.S. PATENT DOCUMENTS

| 4,691,301 | A | 9/1987 | Anderson |
| 4,719,601 | A | 1/1988 | Gray et al. |
| 5,377,146 | A | 12/1994 | Reddy et al. |
| 6,807,114 | B2 * | 10/2004 | Keeth et al. ................. 365/200 |
| 7,035,152 | B1 | 4/2006 | Bae et al. |
| 7,054,207 | B2 | 5/2006 | Keeth et al. |
| 7,064,990 | B1 | 6/2006 | Dawson et al. |
| 7,079,432 | B2 | 7/2006 | Kato et al. |
| 7,443,744 | B2 * | 10/2008 | Behrends et al. ............ 365/200 |
| 2004/0022110 | A1 | 2/2004 | Haraguchi et al. |
| 2004/0076042 | A1 * | 4/2004 | Wu et al. .................... 365/200 |
| 2005/0273670 | A1 | 12/2005 | Park |

* cited by examiner

*Primary Examiner*—Hoai V Ho
*Assistant Examiner*—Kretelia Graham
(74) *Attorney, Agent, or Firm*—Cantor Colburn LLP; Michael LeStrange (57) ABSTRACT

A system for implementing a memory column redundancy scheme is provided. The system comprises a core array having a plurality of columns and a redundancy column each configured for reading or writing a bit of information and circuitry for steering around a defective column in the core array, wherein the circuitry includes one column multiplexor, which results in having the memory column redundancy scheme include one multiplexing stage.

10 Claims, 6 Drawing Sheets

MEMORY COLUMN REDUNDANCY SCHEME

BACKGROUND OF THE INVENTION

1. Field of the Invention

This invention relates to integrated circuit memory devices, and particularly to a system for implementing a memory column redundancy scheme.

2. Description of Background

Figure 1:
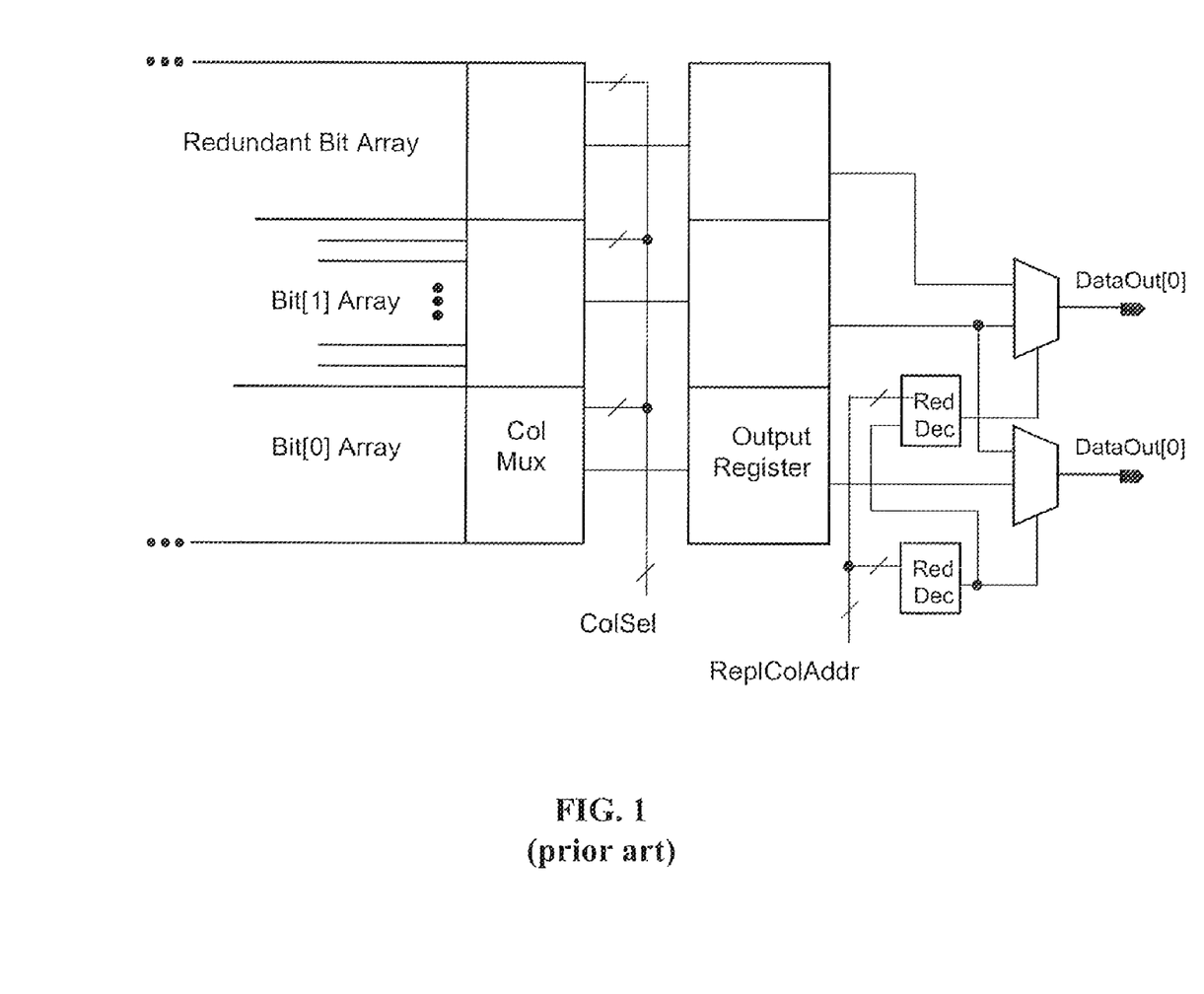
FIG. 1 illustrates an exemplary existing architecture implementing column redundancy using two stages of multiplexing.

Existing memory architectures with column redundancy typically have two levels of multiplexing, each providing its own contribution to memory access time. FIG. 1 illustrates an existing architecture. FIG. 1 generally illustrates a simple form of column multiplexing which involves completely replicating a bit of the memory word (here, a "bit" includes a memory array, column mux, and input and output circuit) such that, for example a 2K×16 RAM becomes a 2K×17 RAM; and selecting the full extra (redundant) bit in place of one of the original bits if there is a defect in the memory array of one of the original bits. One of the drawbacks for this type of architecture is that the area overhead of this type of column redundancy is large because a full data bit is replicated. For example, in an "×16" RAM with a 32:1 column mux, 32 bit lines are replicated in the extra bit.

Figure 2:
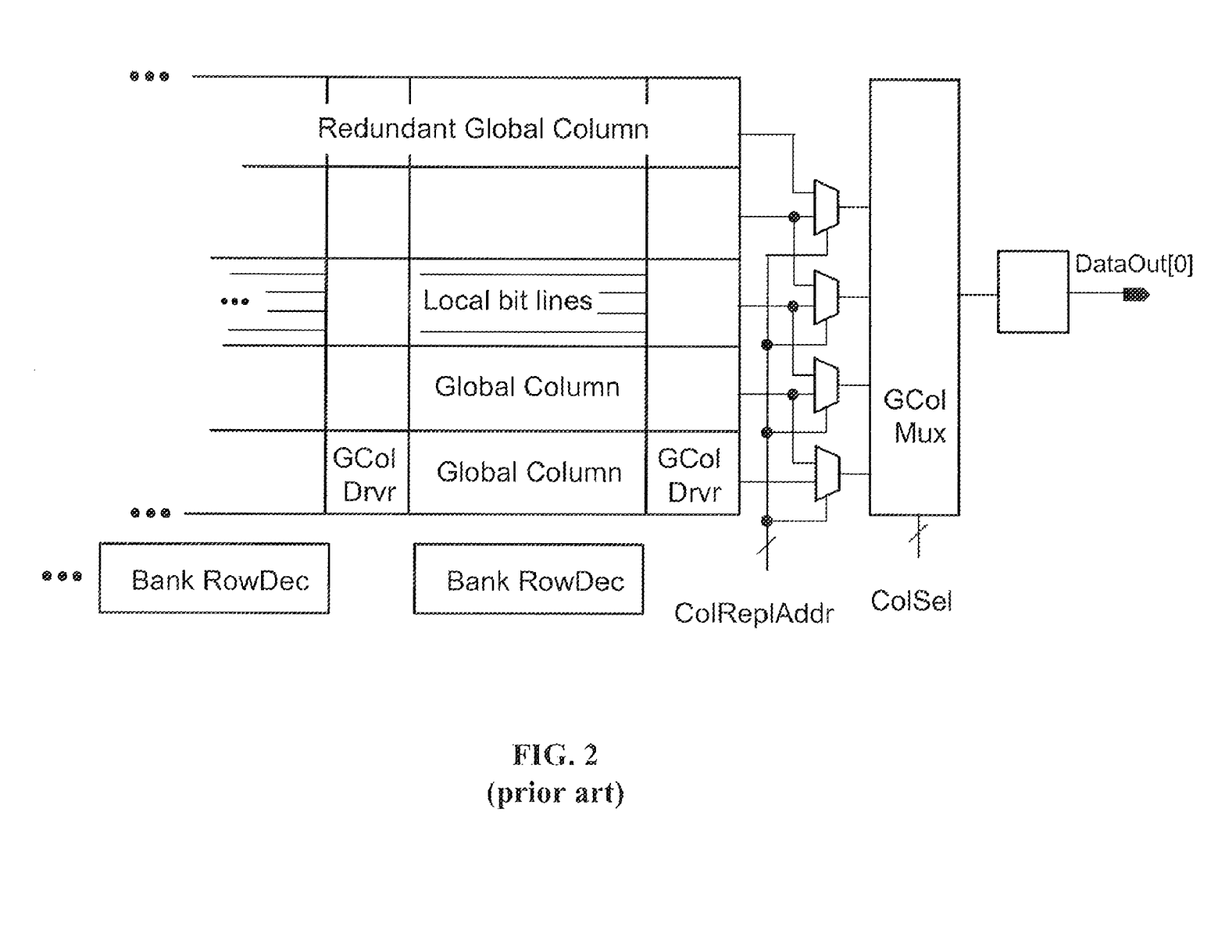
FIG. 2 illustrates another exemplary existing architecture implementing column redundancy using two stages of multiplexing.

Advanced Static Random Access Memorys (SRAMs) require a hierarchy of local bit lines and global bit lines. The bit-line hierarchy scheme is illustrated in FIG. 2, where a global bit line is common to a number of banks. In each bank, a number of short local bit lines are associated with a global bit line driver ("GColDrvr"). The global bit line driver cannot match the local bit-line pitch. As such, a first level of multiplexing the local bit lines is essential for hierarchical bit lines, which cannot be eliminated or simplified. A 4:1 mux is common for this first stage, and is integrated into the area of the global bit line driver. A smaller number of global bit lines, on relaxed pitch, continue to the edge of the array for a second level of multiplexing. The GlColMux and GlColSel lines achieve this second state of multiplexing. In the example of FIG. 2, the GColMux block is implementing a 4:1 multiplexing, which compounds the 4:1 mux at the GColDrvr to implement a 16:1 overall bit-line multiplex. The intermediate pitch of the global bit lines makes a more efficient form of column redundancy possible: a global column with 4 local bit lines can be the redundant unit multiplexed in, rather than a full data bit with a larger number (e.g., 16 or 32) of bit lines. Existing hierarchical RAMs have separate multiplexors for the global bit line to DataOut mux and for the redundancy steering. However, these two distinct muxes add delay to the access time.

In either multiplexing scheme, the decoding for the select lines of the redundancy mux is "static"; i.e., it is done at power-on and is not part of the access delay. The data path, however, is part of the access delay.

SUMMARY OF THE INVENTION

The shortcomings of the prior art are overcome and additional advantages are provided through the provision of a system for implementing a memory column redundancy scheme, the system comprising: a core array having a plurality of columns and a redundancy column each configured for reading or writing a bit of information; circuitry for steering around a defective column in the core array comprising: a plurality of redundancy decoders corresponding to each column in the core array, each of the plurality of redundancy decoders having input lines for receiving a column replace address signal and an enable column redundancy signal, the column replace address signal identifying the defective column in the core array and the enable column redundancy signal activating the memory column redundancy scheme; and a plurality of column enable generators corresponding to each column and the redundancy column in the core array and is configured to bypass the defective column and shift down every column within the core array after the defective column consequently having a non-defective column take the place of the defective column and utilizing the redundancy column to take the place of one column adjacent thereto when the plurality of column enable generators correspondingly receive a plurality of replace column signals correspondingly from the plurality of redundancy decoders and a column select signal from a column decoder, the plurality of replace column signals identifying which columns should be replaced by another column or the redundancy column and the column select signal identifying an address of one column to be accessed; and a column multiplexor having a plurality of multiplexors each configured to provide a data path correspondingly between one column in the core array and a data output line when each of the multiplexors receives a plurality of enable column signals from the plurality of column enable generators, the plurality of enable column signals is configured to enable access to one column or the redundancy column in the core array.

The shortcomings of the prior art are overcome and additional advantages are provided through the provision of a method for implementing a memory column redundancy scheme for steering around a defective column in a core array having a plurality of columns and a redundancy column each configured for reading or writing a bit of information, the method comprising: sending a column replace address signal to input lines of a plurality of redundancy decoders that correspond to the plurality of columns in the core array, the column replace address signal identifying the defective column in the core array; sending an enable column redundancy signal to the plurality of redundancy decoders for activating the memory column redundancy scheme; bypassing the defective column and shifting down every column within the core array after the defective column consequently having a non-defective column take the place of the defective column and utilizing the redundancy column to take the place of one column adjacent thereto by a plurality of column enable generators corresponding to each column and the redundancy column in the core array when the plurality of column enable generators correspondingly receive a plurality of replace column signals from the plurality of redundancy decoders and a column select signal from a column decoder, the plurality of replace column signals identifying which columns should be replaced by another column or the redundancy column and the column select signal identifying an address of one column to be accessed; and configuring a data path correspondingly between one column in the core array and a data output line by a column multiplexor having a plurality of multiplexors when each of the multiplexors receives a plurality of enable column signals from the plurality of enable generators, the plurality of enable column signals is configured to enable access to one column or the redundancy column in the core array.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution for implementing a memory column redundancy scheme for steering around a defective column in a core array having a plurality of columns and a redundancy column each configured for reading or writing a bit of information.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Exemplary embodiments of a system for implementing a memory column redundancy scheme and a method of using the same in accordance with the present invention will now be described with reference to the drawings. The exemplary embodiment of the system described herein is configured to send a column replace address signal to input lines of a plurality of redundancy decoders that correspond to a plurality of columns in a core array where the column replace address signal identifies the defective column in the core array. The exemplary embodiment of the system described herein is further configures to send an enable column redundancy signal to the plurality of redundancy decoders for activating a memory column redundancy scheme. The exemplary embodiment of the system described herein is further configured to bypass a defective column and shift down every column within a core array after the defective column consequently having a non-defective column take the place of the defective column and utilizing a redundancy column to take the place of one column adjacent thereto by a plurality of enable generators corresponding to each column and the redundancy column in the core array when the plurality of column enable generators correspondingly receive a plurality of replace column signals from a plurality of redundancy decoders and a column select signal from a column decoder, where the plurality of replace column signals identifies which columns should be replaced by another column or the redundancy column and the column select signal identifies an address of one column to be accessed. The exemplary embodiment of the system described herein is further configured to configure a data path correspondingly between one column in a core array and a data output line by a column multiplexor having a plurality of multiplexors when each of the multiplexors receives a plurality of enable column signals form a plurality of enable generators, where the plurality of enable column signals is configured to enable access to one column or the redundancy column in the core array.

The inventor herein has recognized that providing a memory column redundancy scheme that integrates two multiplexing stages into a single multiplexing stage eliminates undesirable access time delay.

Figure 3:
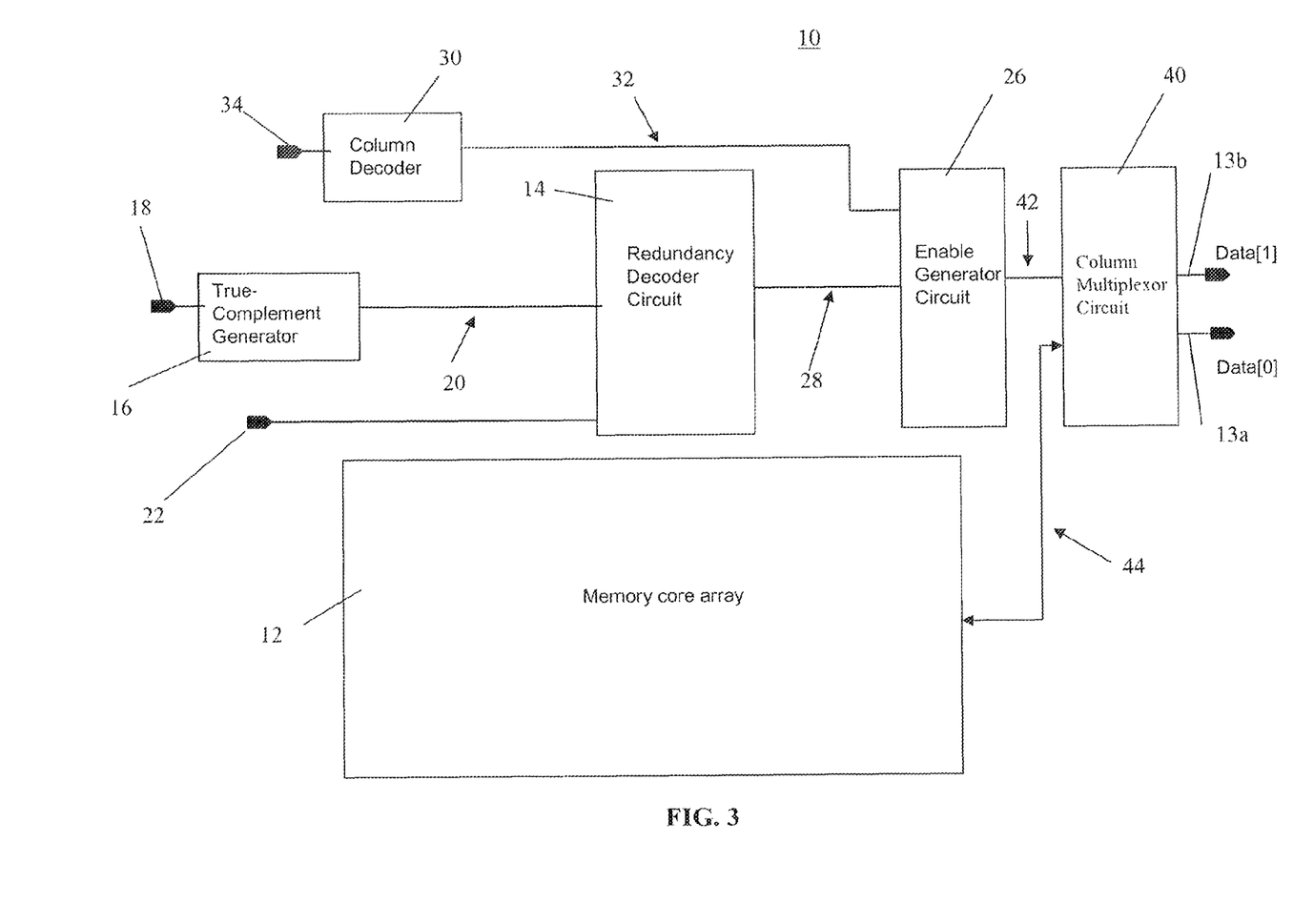
FIG. 3 illustrates a schematic block diagram of a system for implementing a memory column redundancy scheme in accordance with one exemplary embodiment of the present invention.

FIG. 3 is a schematic block diagram of a system 10 for implementing a memory column redundancy scheme for steering around a defective column in a core array according to one embodiment of the present invention. The system 10 includes a memory core array or core array 12 having columns and a redundancy column therein. Each column including the redundancy column is configured to read or write a bit of information. For example, a bit of information (0 or 1) can be read from or written into each of the columns and the redundancy column. The columns and the redundancy column in core array 12 are depicted and labeled in FIG. 4 as Col[0], Col[1], Col[2], Col[3], Col[4], Col[5], Col[6], Col[7], RCol respectively. Of course more or less than eight columns can be disposed in the core array 12, but for simplistic purposes only eight columns along with the redundancy column will be discussed. Any one of columns Col[0]-Col[7] in core array 12 may be accessed via a plurality of data access lines 13a, 13b. Each of the plurality of data access lines 13a, 13b provides Data[0] and Data[1] respectively. In one non-limiting embodiment, Data[0] includes columns Col[0]-Col[3], while Data[1] includes columns Col[4]-Col[7]. As such, Data[0] and Data[1] together make up two data bits of information. For example, Data [0] may consist of column Col[3] while Data[1] may consist of column Col[7], depending on the address of one column being accessed. Of course, one or more data bits may be accessed depending on the application and should not be limited to the number being accessed in the configuration as shown.

Figure 4:
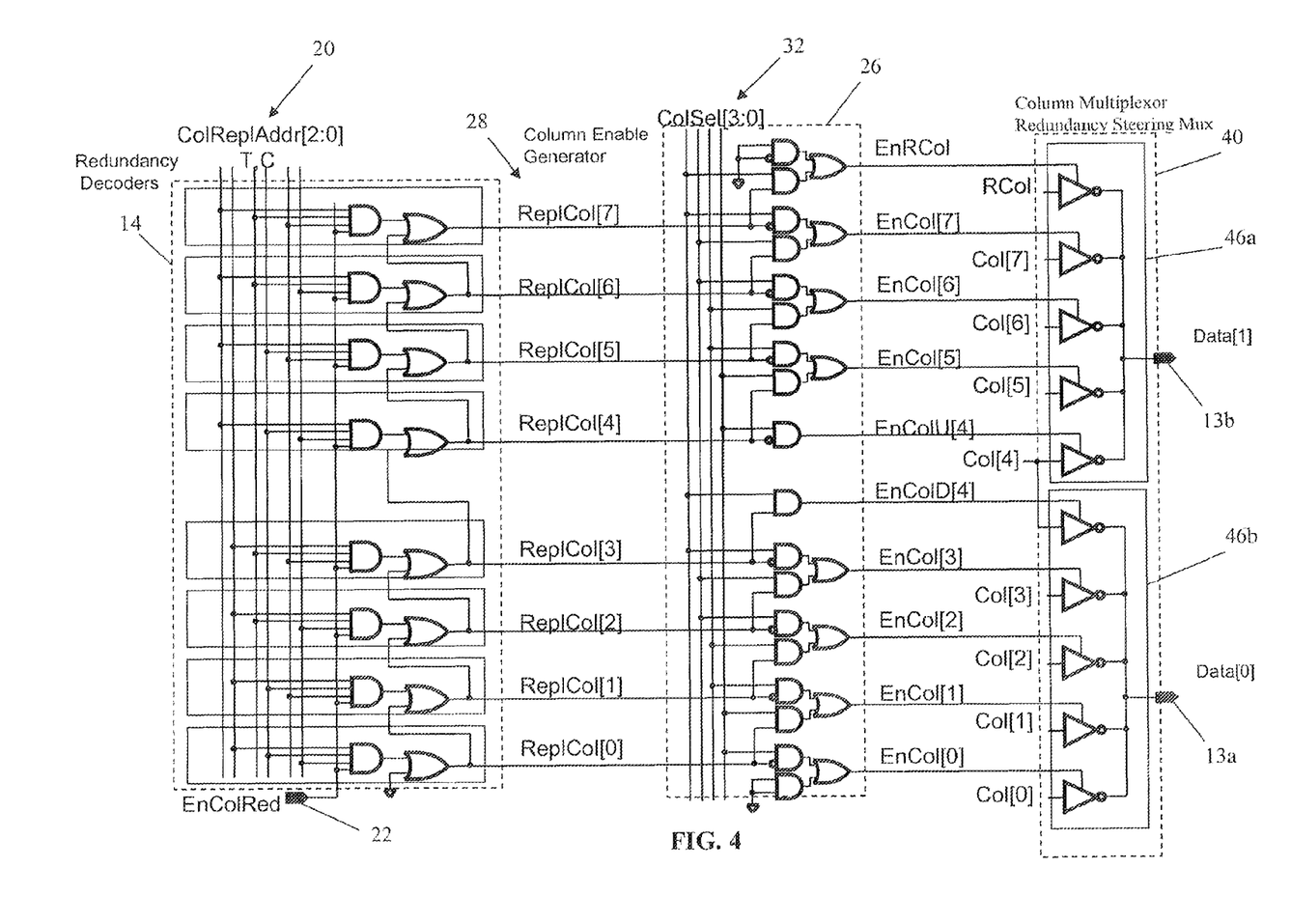
FIG. 4 illustrates a schematic of the system implementing the memory column redundancy scheme for a Read operation in accordance with one exemplary embodiment of the present invention.
Figure 5:
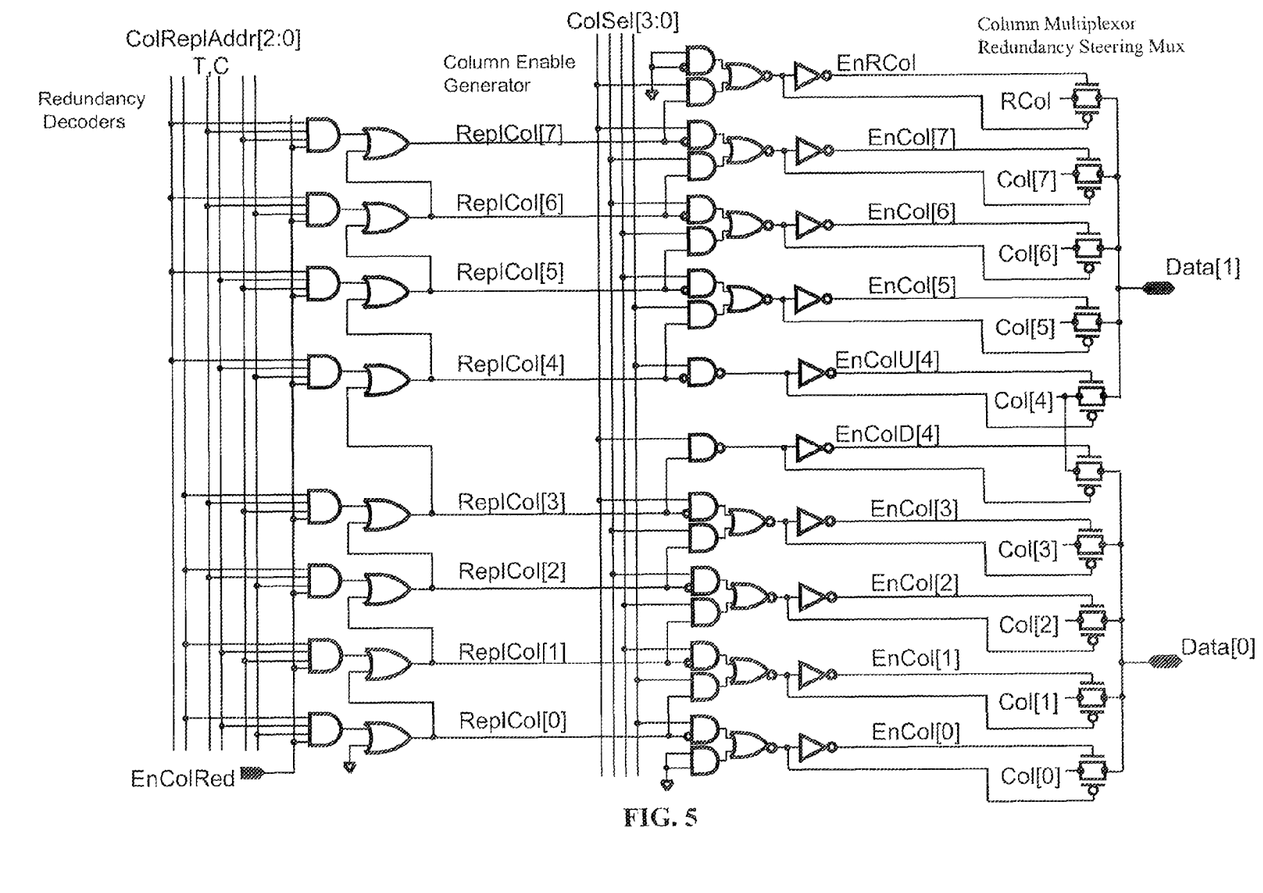
FIG. 5 illustrates a schematic of the system implementing the memory column redundancy scheme for a Write operation as well as the Read operation in accordance with one exemplary embodiment of the present invention.

It is contemplated that more than one redundancy column could be used in exemplary embodiments of the present invention and should not be limited to the configuration as shown. It should be understood that the core array 12 may comprise of a hierarchy of columns in various configurations. The hierarchy as shown in FIGS. 4-5 is exemplary in nature and should not be limiting.

The system 10 further includes a redundancy decoder circuit 14 in data communication with a true-complement (T/C) generator 16 in accordance with one exemplary embodiment of the present invention. The redundancy decoder circuit 14 comprises a plurality of column redundancy decoders therein. In one embodiment, the plurality of column redundancy decoders respectively corresponds to each column in core array 12. The T/C generator 16 includes a data input line 18 for receiving a signal identifying a defective column in core array 12 from a tester (not shown). The T/C generator 16 is configured to generate a column replace address (ColRep1Addr) signal from the signal inputted by the tester and send the column replace address signal through T/C generator data output lines of T/C generator 16. In one embodiment, the column replace address signal is a result of the true-complement form of the signal inputted by the tester. The T/C generator data output lines of T/C generator 16, for simplistic purposes, are depicted in FIG. 3 as data line 20. As such, data line 20 is representative of the data output lines of T/C generator 16. The column replace address signal sent via data line 20 from T/C generator 16 is received or presented to the plurality of column redundancy decoders of redundancy decoder circuit 14 for identifying the defective column in the core array 12.

In accordance with one exemplary embodiment, the defective column in the core array 12 is detected by running a memory test, at either a wafer level or packaged chip level. The memory test determines if any column defects in the array need to be repaired using column redundancy. The memory test may be any conventional memory test used for testing a memory core array of any column defects at either a wafer level, packaged chip level or otherwise. As such, in operation, when a tester determines that a defective column exists in core array 12 after running the memory test, the tester inputs the signal through data line 18 of T/C generator 16 identifying the defective column in the core array 12, thus resulting in the column replace address signal, which is sent through data line 20 to the plurality of column redundancy decoders of redundancy decoder circuit 14. In other words, once the tester determines that a defective column exists in the core array 12 using a conventional memory test, the tester sends a signal through data line 18, in which the T/C generator 16 takes the true-complement form of the signal, resulting in the column replace address signal being sent to redundancy decoder circuit 14 via data line 20.

In an alternative exemplary embodiment, the tester stores the defect information into a non-volatile memory (not shown), such as flash Random Access Memory (RAM) or the like. The system 10 reads this stored information and provides this information through data line 18.

In one embodiment, the redundancy decoder circuit 14 includes an input data line 22 configured for activating the memory redundancy scheme. In one embodiment, the input line 22 is set high or to logic 1 to enable column redundancy and provide an enable column redundancy (EnColRed) signal via input line 22 of redundancy decoder circuit 14. When the input line 22 is set low or to logic 0, column redundancy is not enabled.

Each column redundancy decoder in the redundancy decoder circuit 14 includes a logical circuit made up of one or more logical gates (e.g., logical AND gate). In one non-limiting embodiment, each column redundancy decoder in the redundancy decoder circuit 14 includes one logical AND gate and one logical OR gate. Of course, each column redundancy decoder may include more or less than the logical gates shown in FIG. 4 as well as other various logical gates and should not be limited to the configuration as shown in FIG. 4. The plurality of column redundancy decoders of the redundancy decoder circuit 14 is configured to correspondingly provide a plurality of replace column (ReplCol) signals based on the column replace address signal and the enable column redundancy signal. The plurality of replace column signals is configured to identify which columns in the core array should be replaced by another column or redundancy column. Each of the plurality of replace column signals corresponds to each column in core array 12. In this example, the replace column signals are shown as ReplCol[0], ReplCol[2], ReplCol[3], ReplCol[4], ReplCol[5], ReplCol[6], and ReplCol[7]. Of course, more or less replace column signals may be provided depending on the application and should not be limited to the configuration as shown. Any of the plurality of replace column signals may be set high or to logic 1 based on the column replace address signal and the enable column redundancy signal. The plurality of replace column signals set high indicate which of the corresponding columns in the core array 12 are to be replaced by another column or the redundancy column. For example, if column 2 is determined to be defective as discussed above, then ReplCol[0] and ReplCol[1] will be set to logic 0 or set low and ReplCol[2]-ReplCol[7] will be set to logic 1 or set high based on the column replace address signal and the enable column redundancy signal and how those signals go through the logical gates of each column redundancy decoder. As such, Col[3] will replace Col[2], Col[4] will replace Col[3], and so on. RCol will replace Col[7], which is the last column in core array 12. When no defects are found, then Col[7] is the last column; however, RCol is located adjacent to Col[7] in an end location within core array 12.

The system further includes an enable generator circuit 26 in data communication with redundancy decoder circuit 14 in accordance with one exemplary embodiment of the present invention. The enable generator circuit 26 is in data communication with redundancy decoder circuit 14 via a data line 28. For simplistic purposes, data line 28 is depicted in FIG. 3 to be representative of a plurality of data output lines of redundancy decoder circuit 14 in which the plurality of replace column signals are respectively sent through. The enable generator circuit 26 comprises a plurality of column enable generators therein. In one embodiment, the plurality of column enable generators corresponds to each column and the redundancy column in core array 12.

Each column enable generator of enable generator circuit 26 includes a logical circuit made up of one or more logical gates (e.g., logical AND gate). In one embodiment, each column enable generator in the enable generator circuit 26 includes two logical AND gates and one logical OR gate. Of course, each column enable generator may include more or less devices than the logical gates as shown as well as other various logical gates and should not be limited to the configuration as shown in FIG. 4. The plurality of column enable generators of enable column generator circuit 26 is configured to correspondingly provide a plurality of enable column signals for enabling access to one column or the redundancy column in core array 12 based on the plurality of replace column signals and a column select signal from a column decoder 30 in accordance with one exemplary embodiment of the present invention. In this example, the enable column signals are shown as EnCol[0], EnCol[1], EnCol[2], EnCol[3], EnColU[4], EnColD[4], EnCol[5], EnCol[6], EnCol[7], and EnRCol. Each of the plurality enable column signal correspond to each column and the redundancy column in core array 12. In one embodiment, one column in core array 12 corresponds to two of the plurality of enable column signals in the case where column redundancy needs to be implemented. In this example, Col[4] corresponds EnColU[4] and EnColD[4]. In doing so, Col[4] may be part of Data[0] or Data[1] depending if a defective column is found in core array 12. For example, if Col[2] is found to be defective, then Col[3] takes the place of Col[2] and Col[4] takes the place of Col[3], resulting in Data[0] to comprise of Col[0], Col[1], Col[3], and Col[4]. Consequently, in this same example, Data[1] will comprise of Col[5], Col[6], Col[7], and RCol accordingly.

The plurality of column enable generators of enable generator circuit 26 is configured to bypass the defective column and shift down every column within core array 12 after the defective column as described above. As such, a non-defective column takes the place of the defective column and the redundancy column is utilized to take the place of one column adjacent thereto. This shifting is based on the plurality of replace column signals and the column select signal from the column decoder 30. The column decoder 30 will now be described in more detail.

The system 10 further includes the column decoder 30, which is in data communication with enable generator circuit 26 in accordance with one exemplary embodiment of the present invention. The column decoder 30 is in data communication with enable generator circuit 26 via a data line 32. The column select signal is sent to enable generator circuit 26 via data line 32. The column select signal is configured to identify an address of one column in core array 12 to be accessed via data line 32. The column decoder 30 can be any conventional column decoder. In one embodiment, the column select signal is a result of the decoded form of a column address signal received at a data input line of column decoder 30. The data input line of column decoder 30 is depicted in FIG. 3 as data line 34. In operation, when an address of one column in core array 12 is desired to be accessed, the column address signal is provided to column decoder 30 via data line 34, which results into the column select signal being sent to enable generator circuit 26 via data line 32 for identifying the address of one column in core array to be accessed. Consequently, enable generator circuit 26 receives the plurality of column replace signals from redundancy decoder circuit 14 and the column select signal from column decoder 30.

The system further includes a column multiplexor circuit 40 comprising a plurality of multiplexors therein. Each of the plurality of multiplexors is configured to provide a data path correspondingly between one column or the redundancy column in core array 12 and one of the data access lines 13*a*, 13*b*. In one embodiment, each of the plurality of multiplexors includes three-state inverters configured for a Read operation. In this scheme, data access lines 13*a*, 13*b* are unidirectional. Advantageously, column multiplexor circuit 40 performs both functions of steering around a defective column and selecting a unique column based on the column select signal. In one embodiment, column multiplexor circuit 40 receives enable column signals from enable generator circuit via a data line 42 for steering around the defective column and selecting the unique column based on the column select signal. The enable column signals are configured to enable access to one column or the redundancy column in core array 12. The column multiplexor circuit 40 is in data communication with core array 12 via data line 44 for Read/Write operations. As such, when the enable column signals are sent to column multiplexor circuit 40, column multiplexor circuit 40 steers around the defective column and selects the unique column in core array 12 identified by the column select signal.

In one embodiment, column multiplexor 40 includes two multiplexors 46*a*, 46*b*. Of course, column multiplexor 40 may comprise of more than two multiplexors depending on the application and should not be limited to the configuration shown in FIG. 4. Each multiplexor of column multiplexor 40 corresponds to one or more columns and the redundancy column of core array 12. The multiplexor 46*a* is a 5:1 multiplexor which corresponds to Col[0]-Col[4] and multiplexor 44*b* is a 5:1 multiplexor which corresponds to Col[4]-RCol. In one instance, no columns in core array 12 are found defective. In the instance where one column is found defective, then columns in core array 12 are shifted down as described above and the redundancy column is utilized and becomes part of, for example, Data[1]. In this scheme, the data access lines 13*a*, 13*b* are unidirectional allowing signals from Data[0] and Data[1] to be read. In accordance with one embodiment, the multiplexors as well as the two enable column signals EnColU[4] and EnColD[4] fit the global column pitch of core array 12.

In accordance with another exemplary embodiment of the present invention, the above described scheme may be altered so that data access line 13*a*, 13*b* are bi-directional as shown in FIG. 5, allowing signals from Data[0] and Data[1] to be written to one or more of the columns in core array 12. In other words, switch circuitry between each column and the redundancy column in core array 12 and data access lines 13*a*, 13*b* may be bidirectional pass-gates instead of unidirectional circuits for a Write operation and the Read operation.

Figure 6:
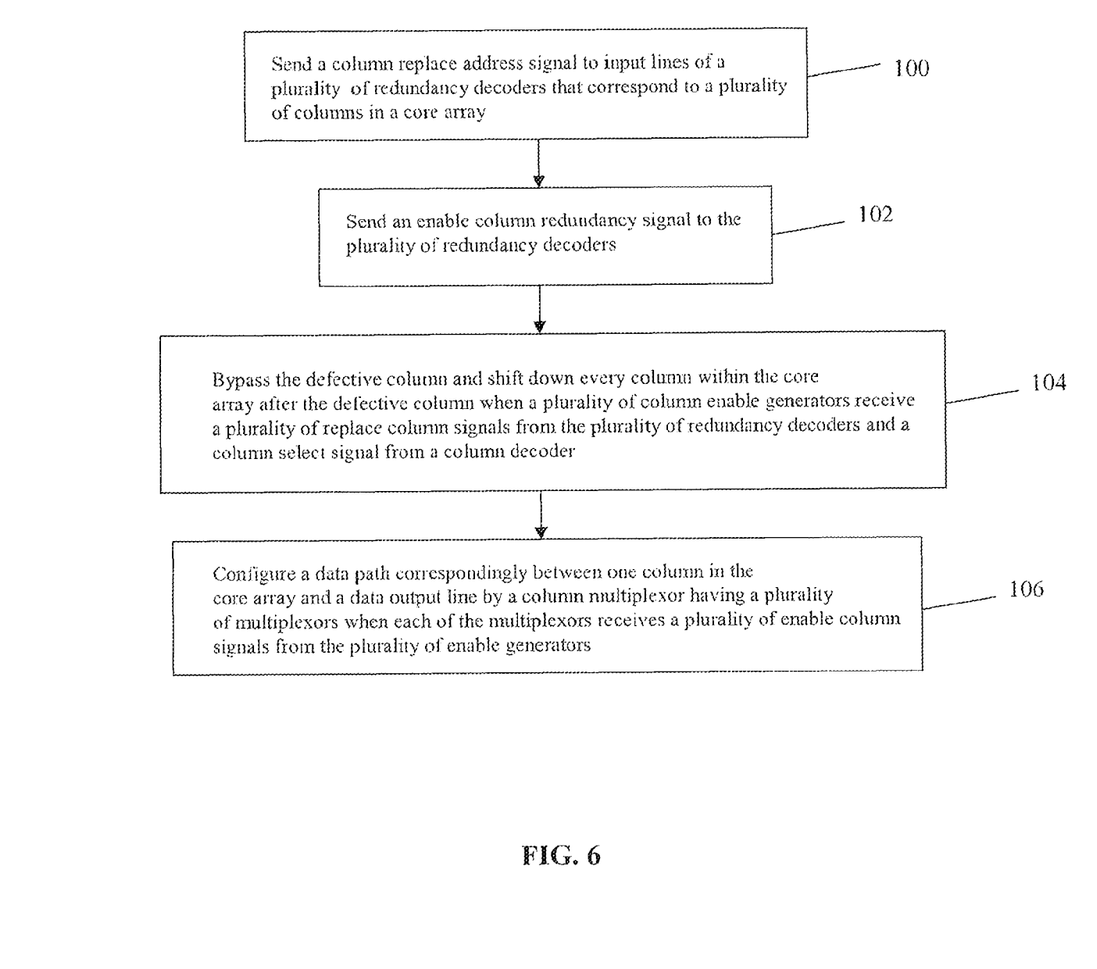
FIG. 6 illustrates a flow-chart diagram that provides a method for implementing a memory column redundancy scheme for steering around a defective column in a core array.

In accordance with an exemplary embodiment of the present invention, an exemplary method for implementing a memory column redundancy scheme is provided and illustrated in FIG. 6. In this exemplary method, send a column replace address signal to input lines of a plurality of redundancy decoders that correspond to a plurality of columns in a core array at block 100. The column replace address signal identifies the defective column in the core array. Then, send an enable column redundancy signal to the plurality of redundancy decoders at block 102. This activates the memory column redundancy scheme. Next, bypass the defective column and shift down every column within the core array after the defective column when a plurality of column enable generators receive a plurality of replace column signals from the plurality of redundancy decoders and a column select signal from a column decoder at block 104. Consequently, a non-defective column takes the place of the defective column and the redundancy column takes the place of one column adjacent thereto. The plurality of column enable generators corresponds to each column and the redundancy column in the core array. The plurality of replace column signals identify which columns should be replaced by another column or the redundancy column while the column select signal identifies an address of one column to be accessed. At block 106, configure a data path correspondingly between one column in the core array and a data output line by a column multiplexor having a plurality of multiplexors when each of the multiplexors receives a plurality of enable column signals from the plurality of enable generators. The plurality of column enable signals is configured to enable access to one column or the redundancy column in the core array.

The schemes shown in FIGS. 3-5 allow for less overall delay in access time by having only one multiplexing stage (column multiplexor circuit 40). However, there is a small incremental added delay of these schemes because the single multiplexing stage has slightly higher parasitic capacitance than existing architectures. For example, in FIG. 5 what could have been a 4:1 mux is now a 5:1 mux. Similarly, an 8:1 mux will become a 9:1 mux. In the schemes described above, there is extra delay in the control signals to the column multiplexor circuit (e.g., extra A022 delay). However, during a Read operation, the enable column signals are not required until after, for example, bank select, row decode and drive, local bit line signal development and amplification, and global column signal development.

Advantageously, a communication path is formed between the redundancy decoder circuit 14, the enable generator circuit 26, and the column multiplexor circuit 40. In one embodiment, the communication path forms from the redundancy decoder circuit 14 to the enable generator circuit 26 and through the column multiplexor circuit 40 and out data access lines 13*a*, 13*b*. A data path is formed between core array 12 and the data outputs Data[0] and Data[1]. As such, a critical delay path is formed between signal 44 and data access lines 13a, 13b. Consequently, having only one multiplexing stage reduces access time compared to prior architectures where more than one multiplexing stage is present.

It should be understood that the data lines described above could each be representative of a plurality of data lines in accordance with one exemplary embodiment. Furthermore, the signal being sent through each data line may be representative of a plurality of signals thereof in accordance with one exemplary embodiment.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A system for implementing a memory column redundancy scheme, the system comprising:
    a core array having a plurality of columns and a redundancy column each configured for reading or writing a bit of information;
    circuitry for steering around a defective column in the core array, the circuitry further comprising:
        a plurality of redundancy decoders corresponding to each column in the core array, each of the plurality of redundancy decoders having input lines for receiving a column replace address signal and an enable column redundancy signal, the column replace address signal identifying the defective column in the core array and the enable column redundancy signal activating the memory column redundancy scheme; and
        a plurality of column enable generators corresponding to each column and the redundancy column in the core array and is configured to bypass the defective column and shift down every column within the core array after the defective column consequently having a non-defective column take the place of the defective column and utilizing the redundancy column to take the place of one column adjacent thereto when the plurality of column enable generators correspondingly receive a plurality of replace column signals correspondingly from the plurality of redundancy decoders and a column select signal from a column decoder, the plurality of replace column signals identifying which columns should be replaced by another column or the redundancy column and the column select signal identifying an address of one column to be accessed; and
    a column multiplexor having a plurality of multiplexors each configured to provide a data path correspondingly between one column in the core array and a data output line when each of the multiplexors receives a plurality of enable column signals from the plurality of column enable generators, the plurality of enable column signals is configured to enable access to one column or the redundancy column in the core array.

2. The system as in claim 1, wherein the column multiplexer steers around the defective column and selects one column or the redundancy column based on the column select signal.

3. The system as in claim 1, wherein the plurality of multiplexers are configured fit a column pitch of the core array.

4. The system as in claim 1, wherein the column replace address signal is generated from a true-complement generator configured to receive a signal from a tester identifying the defective column and enabling the enable column redundancy signal for activating the memory column redundancy scheme.

5. The system as in claim 1, wherein a data path forms from the redundancy decoder circuit to enable generator circuit and through the column multiplexor and out a plurality of data access lines.

6. A method for implementing a memory column redundancy scheme for steering around a defective column in a core array having a plurality of columns and a redundancy column each configured for reading or writing a bit of information, the method comprising:
    sending a column replace address signal to input lines of a plurality of redundancy decoders that correspond to the plurality of columns in the core array, the column replace address signal identifying the defective column in the core array;
    sending an enable column redundancy signal to the plurality of redundancy decoders for activating the memory column redundancy scheme;
    bypassing the defective column and shifting down every column within the core array after the defective column consequently having a non-defective column take the place of the defective column and utilizing the redundancy column to take the place of one column adjacent thereto by a plurality of column enable generators corresponding to each column and the redundancy column in the core array when the plurality of column enable generators correspondingly receive a plurality of replace column signals from the plurality of redundancy decoders and a column select signal from a column decoder, the plurality of replace column signals identifying which columns should be replaced by another column or the redundancy column and the column select signal identifying an address of one column to be accessed; and
    configuring a data path correspondingly between one column in the core array and a data output line by a column multiplexor having a plurality of multiplexors when each of the multiplexors receives a plurality of enable column signals from the plurality of enable generators, the plurality of column enable signals is configured to enable access to one column or the redundancy column in the core array.

7. The method as in claim 6, wherein the column multiplexor steers around the defective column and selects one column or the redundancy column based on the column select signal.

8. The method as in claim 6, wherein the plurality of multiplexors are configured fit a column pitch of the core array.

9. The method as in claim 6, wherein the column replace address signal is generated from a true-complement generator configured to receive a signal from a tester identifying the defective column and enabling the enable column redundancy signal for activating the memory column redundancy scheme.

10. The method as in claim 6, wherein a data path forms from the redundancy decoder circuit to enable generator circuit and through the column multiplexor and out a plurality of data access lines.

* * * * *